United States Patent
Faltermeier et al.

(10) Patent No.: US 8,835,250 B2
(45) Date of Patent: Sep. 16, 2014

(54) FINFET TRENCH CIRCUIT

(75) Inventors: Jonathan E. Faltermeier, Delanson, NY (US); Veeraraghavan S. Basker, Schenectady, NY (US); Kangguo Cheng, Schenectady, NY (US); Theodorus Eduardus Standaert, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 2 days.

(21) Appl. No.: 13/613,684

(22) Filed: Sep. 13, 2012

(65) Prior Publication Data
US 2014/0070294 A1    Mar. 13, 2014

(51) Int. Cl.
| H01L 21/8242 | (2006.01) |
| H01L 21/20 | (2006.01) |
| H01L 29/94 | (2006.01) |
| H01L 27/108 | (2006.01) |
| H01L 29/66 | (2006.01) |

(52) U.S. Cl.
CPC .... H01L 27/10829 (2013.01); H01L 27/10879 (2013.01); H01L 27/10832 (2013.01); H01L 29/945 (2013.01); *H01L 29/66181* (2013.01); H01L 27/10867 (2013.01); H01L 27/10861 (2013.01)
USPC ........... 438/248; 438/243; 438/244; 438/246; 438/386; 438/387; 438/389; 438/391; 257/301; 257/302; 257/303; 257/304; 257/E27.092; 257/E29.346

(58) Field of Classification Search
CPC ............... H01L 27/1087; H01L 27/10861; H01L 29/66181; H01L 27/10829; H01L 27/10805; H01L 27/108032; H01L 27/10867; H01L 27/10879; H01L 29/945
USPC ......... 257/292, 301–305, E27.092, E21.396, 257/E29.346, E21.651; 438/241–249, 438/386–389, 391
See application file for complete search history.

(56) References Cited

U.S. PATENT DOCUMENTS

| | | | | |
|---|---|---|---|---|
| 4,753,901 | A * | 6/1988 | Ellsworth et al. | 438/427 |
| 4,916,524 | A * | 4/1990 | Teng et al. | 257/302 |
| 5,442,211 | A * | 8/1995 | Kita | 257/301 |
| 6,794,242 | B1 | 9/2004 | Dyer et al. | |
| 7,208,373 | B2 | 4/2007 | Weis | |
| 7,442,609 | B2 | 10/2008 | Wang et al. | |
| 7,700,983 | B2 | 4/2010 | Popp et al. | |
| 7,763,513 | B2 | 7/2010 | Wang et al. | |
| 2004/0248363 | A1* | 12/2004 | Bard et al. | 438/243 |
| 2005/0014331 | A1 | 1/2005 | Yang et al. | |
| 2005/0051825 | A1* | 3/2005 | Fujiwara et al. | 257/308 |
| 2005/0285153 | A1 | 12/2005 | Weis et al. | |
| 2007/0176253 | A1 | 8/2007 | Wang et al. | |
| 2008/0012067 | A1 | 1/2008 | Wu | |
| 2008/0048186 | A1 | 2/2008 | Cheng et al. | |
| 2008/0318377 | A1 | 12/2008 | Lee et al. | |
| 2009/0079030 | A1* | 3/2009 | Cheng et al. | 257/532 |
| 2009/0127586 | A1 | 5/2009 | Gruening-von Schwerin | |
| 2010/0207245 | A1* | 8/2010 | Cheng et al. | 257/532 |

* cited by examiner

*Primary Examiner* — Fernando L Toledo
*Assistant Examiner* — Aaron Gray
(74) *Attorney, Agent, or Firm* — Joseph P. Abate; Howard M. Cohn

(57) ABSTRACT

A finFET trench circuit is disclosed. FinFETs are integrated with trench capacitors by employing a trench top oxide over a portion of the trench conductor. A passing gate is then disposed over the trench top oxide to form a larger circuit, such as a DRAM array. The trench top oxide is formed by utilizing different growth rates between polysilicon and single crystal silicon.

5 Claims, 10 Drawing Sheets ental clarity. In some cases,
FINFET TRENCH CIRCUIT

FIELD OF THE INVENTION

The present invention relates generally to semiconductors, and more particularly, to a finFET integration method and structure.

BACKGROUND OF THE INVENTION

Transistors, such as metal oxide semiconductor field-effect transistors (MOSFETs), are the core building block of the vast majority of semiconductor devices. Some semiconductor devices, such as high performance processor devices, can include millions of transistors. For such devices, decreasing transistor size, and thus increasing transistor density, has traditionally been a high priority in the semiconductor manufacturing industry.

FinFET technology is becoming more prevalent as device size continues to shrink. It is therefore desirable to have improved fabrication methods and structures for utilization of FinFET structures.

SUMMARY OF THE INVENTION

In one embodiment, a method of fabricating a semiconductor structure is provided. The method comprises depositing a dielectric layer on an interior surface of a cavity in a silicon-on-insulator structure, forming a capacitor electrode in a lower portion of the cavity, forming a polysilicon plug on the capacitor electrode, forming an oxide region on the polysilicon plug, forming a finFET, said finFET comprising a plurality of fins and a gate, said gate disposed over a portion of the plurality of fins, wherein the gate is disposed over the oxide region in an upper portion of the cavity.

In another embodiment, a method of fabricating a semiconductor structure is provided. The method comprises depositing a dielectric layer on an interior surface of a cavity in a silicon-on-insulator structure, wherein the silicon-on-insulator structure comprises a first silicon layer, an insulator layer disposed on the first silicon layer; a second silicon layer disposed on the insulator layer, and a nitride layer disposed on the second silicon layer, forming a capacitor electrode in a lower portion of the cavity, forming a polysilicon plug on the capacitor electrode, forming a first oxide region on the polysilicon plug, planarizing the first oxide region to the nitride layer, removing the nitride layer, forming a second oxide region, wherein the second oxide region is disposed over the first oxide region and is disposed over the second silicon layer, and forming a finFET, said finFET comprising a plurality of fins and a gate electrode, said gate electrode disposed over a portion of the plurality of fins, wherein the gate electrode of the finFET is in direct physical contact with the first oxide region in an upper portion of the cavity.

In another embodiment, a semiconductor structure is provided. The structure comprises a finFET. The finFET comprises a plurality of fins and a gate, said gate disposed over a portion of the plurality of fins. The structure further comprises a trench capacitor, the trench capacitor comprising a first electrode, a second electrode, and a dielectric layer disposed between the first electrode and the second electrode. The structure further comprises a polysilicon plug disposed over the second electrode, and a trench top oxide disposed over the polysilicon plug. The gate of the finFET is disposed over the trench top oxide.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

Certain elements in some of the figures may be omitted, or illustrated not-to-scale, for illustrative clarity. In some cases, in particular pertaining to signals, a signal name may be oriented very close to a signal line without a lead line to refer to a particular signal, for illustrative clarity.

Figure 1:
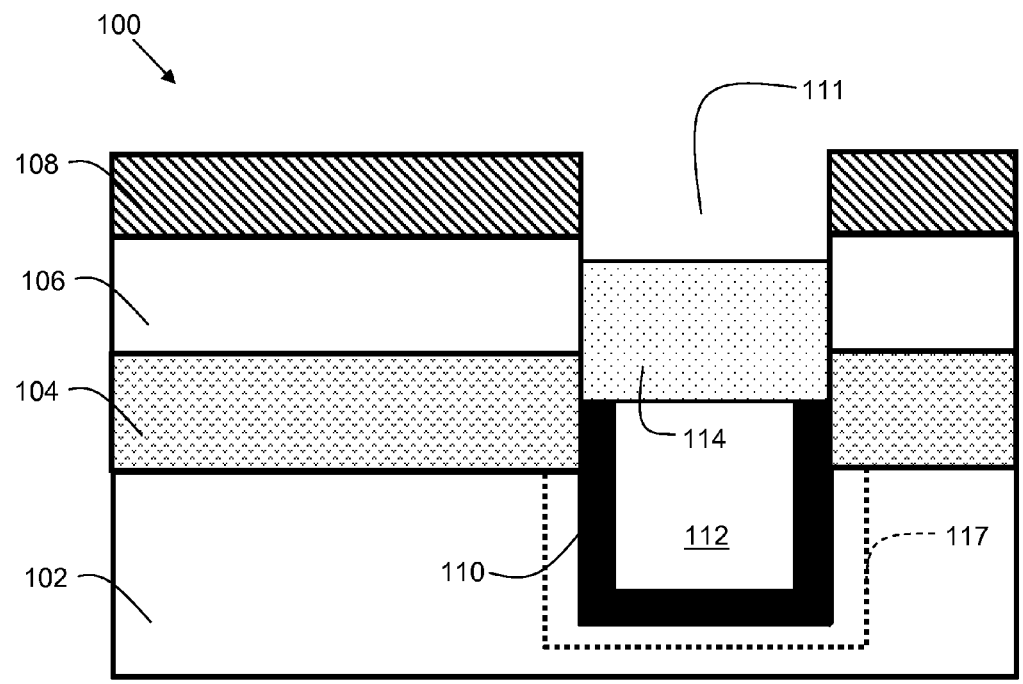

Often, similar elements may be referred to by similar numbers in various figures (FIGs) of the drawing, in which case typically the last two significant digits may be the same, the most significant digit being the number of the drawing figure (FIG). In some cases, reference numbers may not be explicitly referred to in the specification when a similar element has been introduced in a previous figure (FIG). Furthermore, for clarity, some reference numbers and/or features may be omitted in certain drawing figures (FIGs).

FIG. 1 shows a semiconductor structure at a starting point for methods in accordance with embodiments of the present invention.

Figure 2:
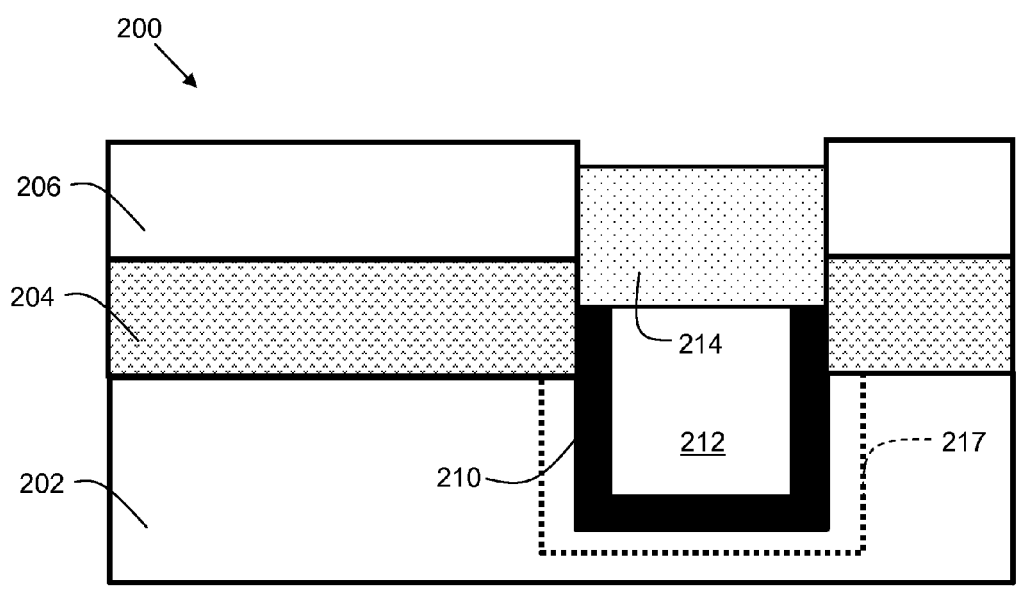

FIG. 2 shows a semiconductor structure after a subsequent step of pad layer removal.

Figure 3:
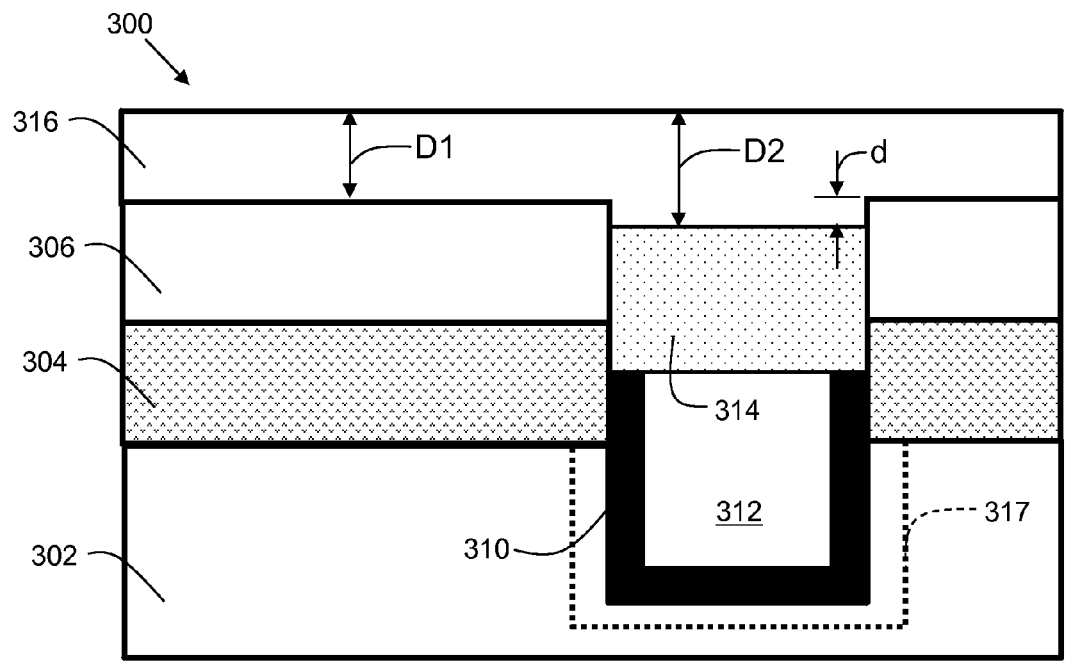

FIG. 3 shows a semiconductor structure after a subsequent step of oxide formation.

Figure 4:
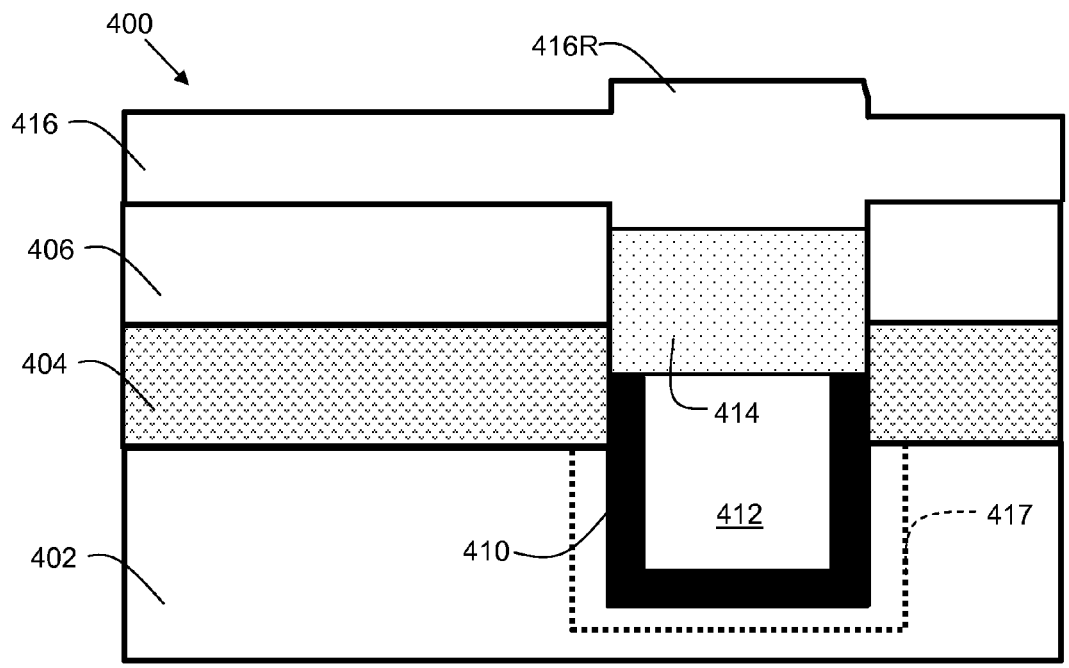

FIG. 4 shows a semiconductor structure of an alternative embodiment after a subsequent step of oxide formation.

Figure 5:
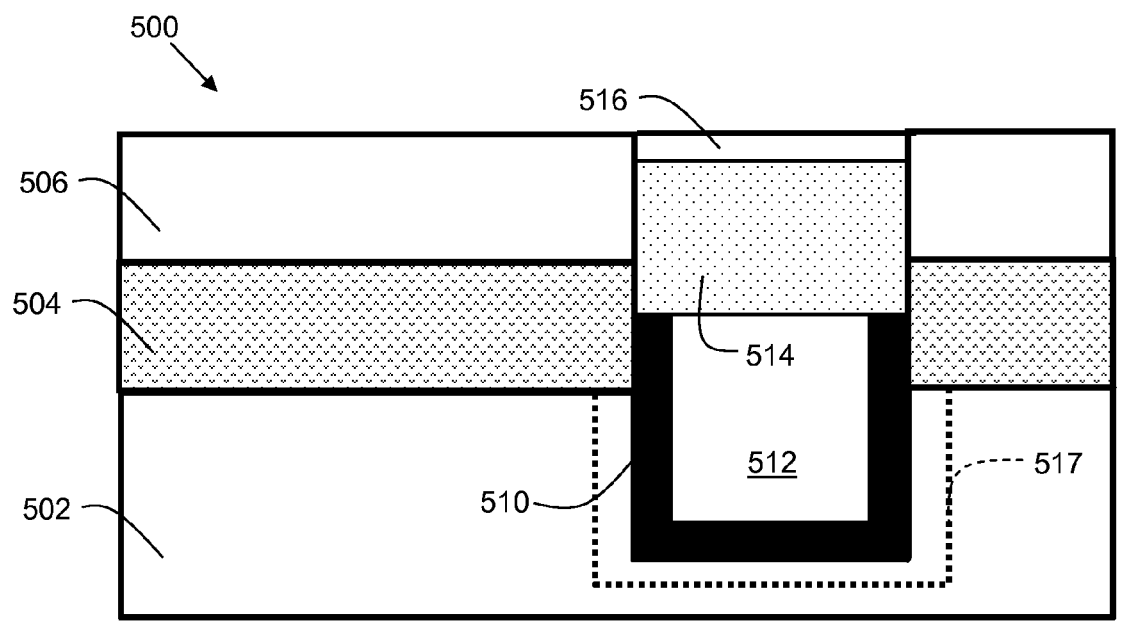

FIG. 5 shows a semiconductor structure after a subsequent step of planarization.

Figure 6:
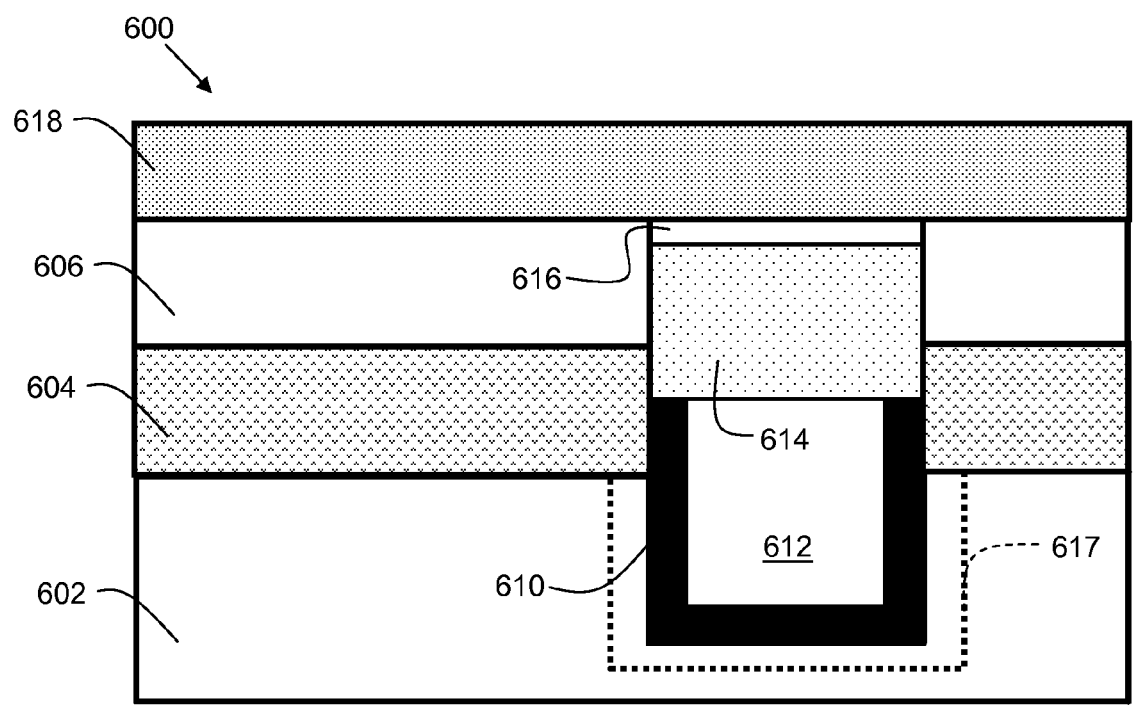

FIG. 6 shows a semiconductor structure after a subsequent step of depositing a fin cap layer.

Figure 7:
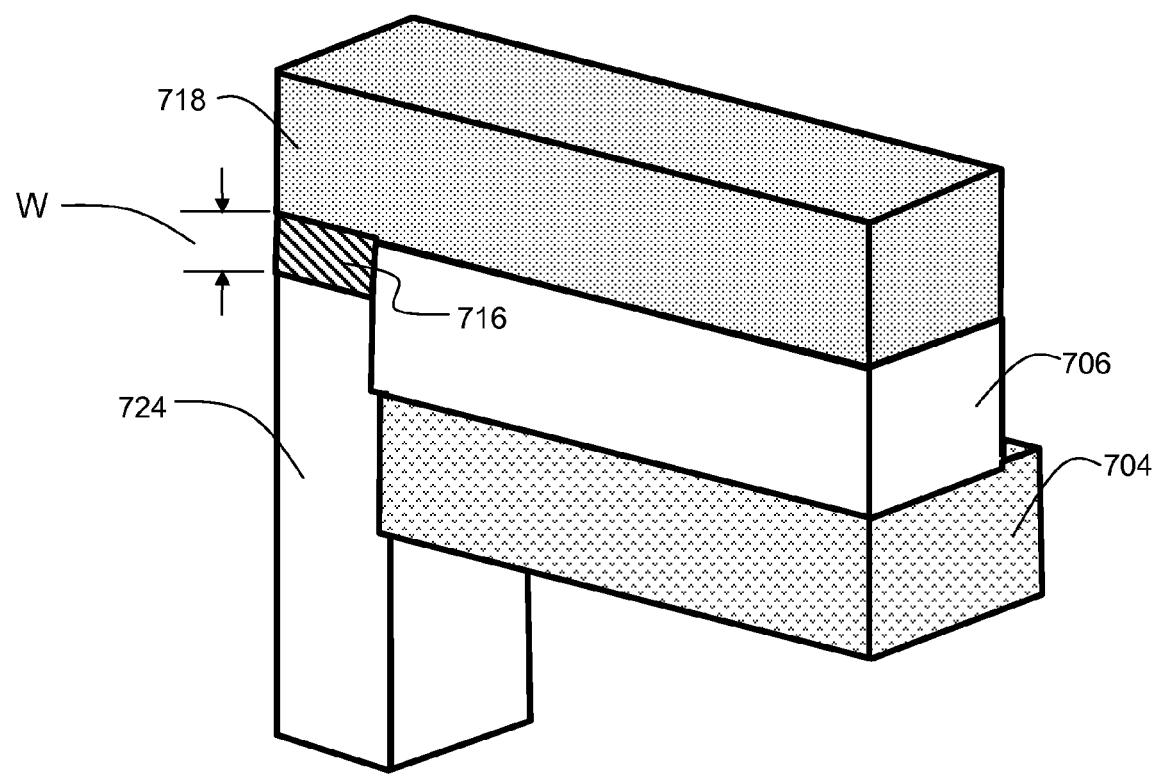

FIG. 7 shows a perspective view of a trench top oxide after deposition of a fin capping layer.

Figure 8:
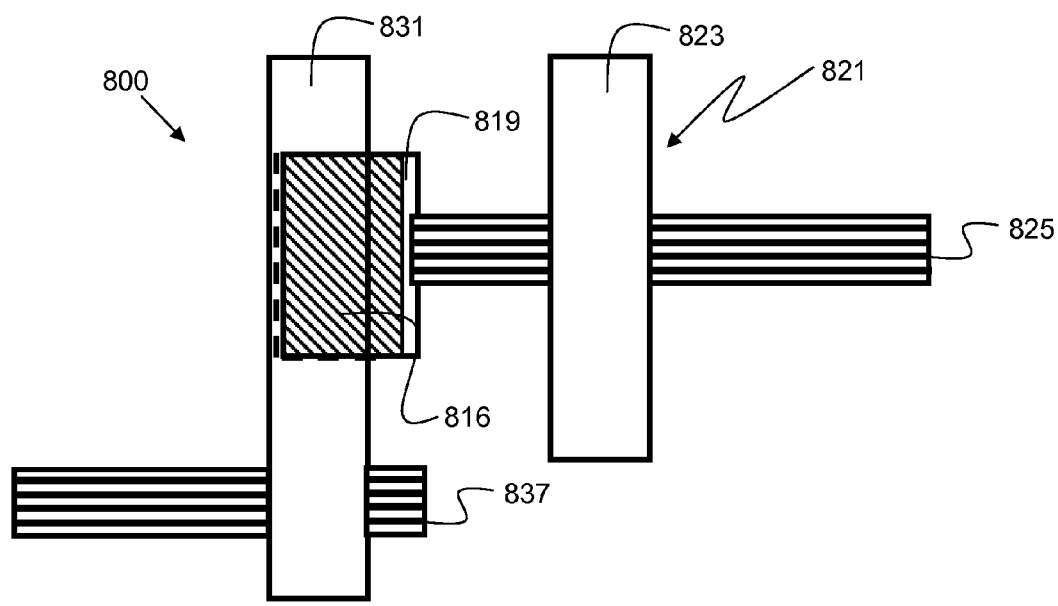

FIG. 8 shows a semiconductor structure in accordance with an embodiment of the present invention showing a portion of the finFET gate electrode disposed over the trench top oxide.

Figure 9:
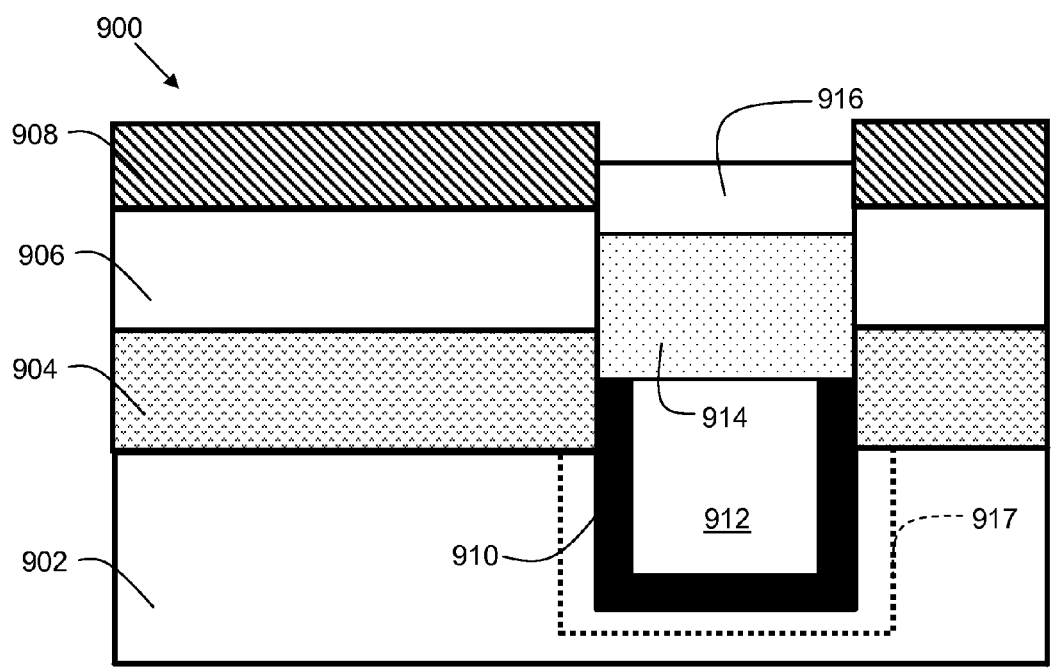

FIG. 9 shows a semiconductor structure at an intermediate fabrication step of a first oxide formation in accordance with an alternative embodiment of the present invention.

Figure 10:
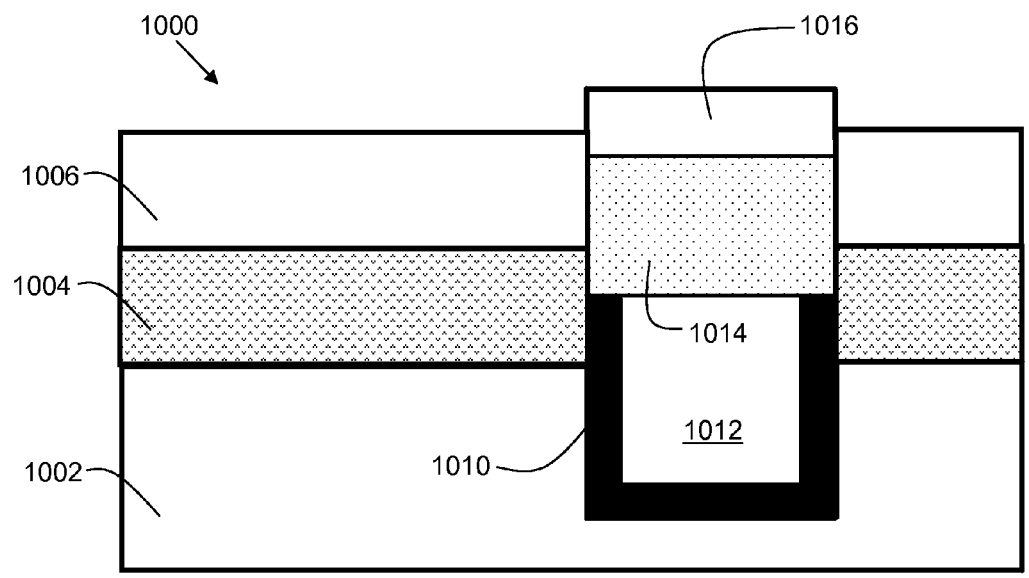

FIG. 10 shows a semiconductor structure at a subsequent processing step of pad layer removal.

Figure 11:
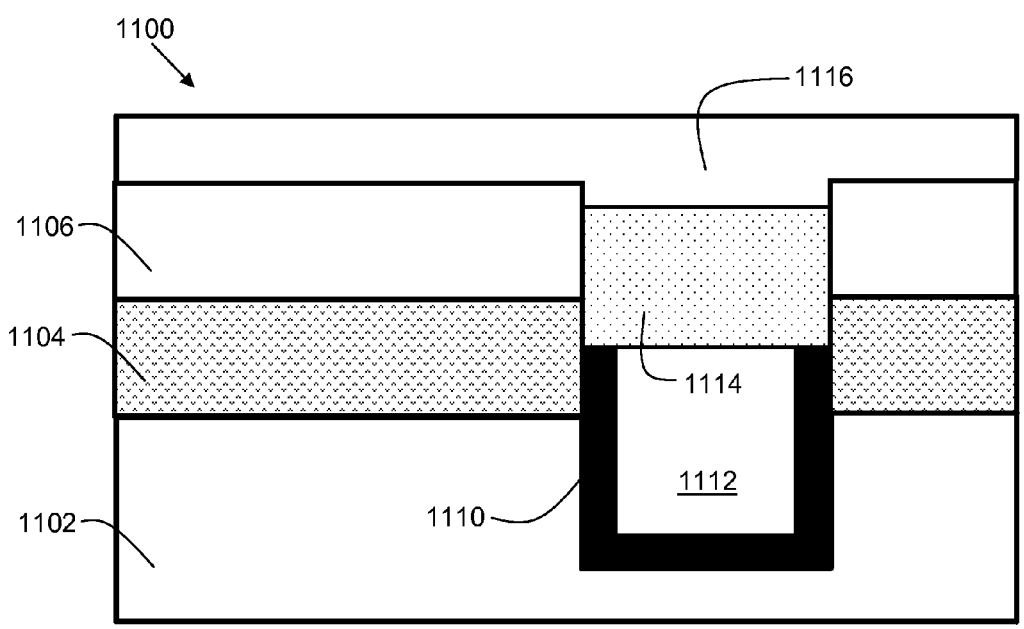

FIG. 11 shows a semiconductor structure at an intermediate fabrication step of a second oxide formation.

Figure 12:
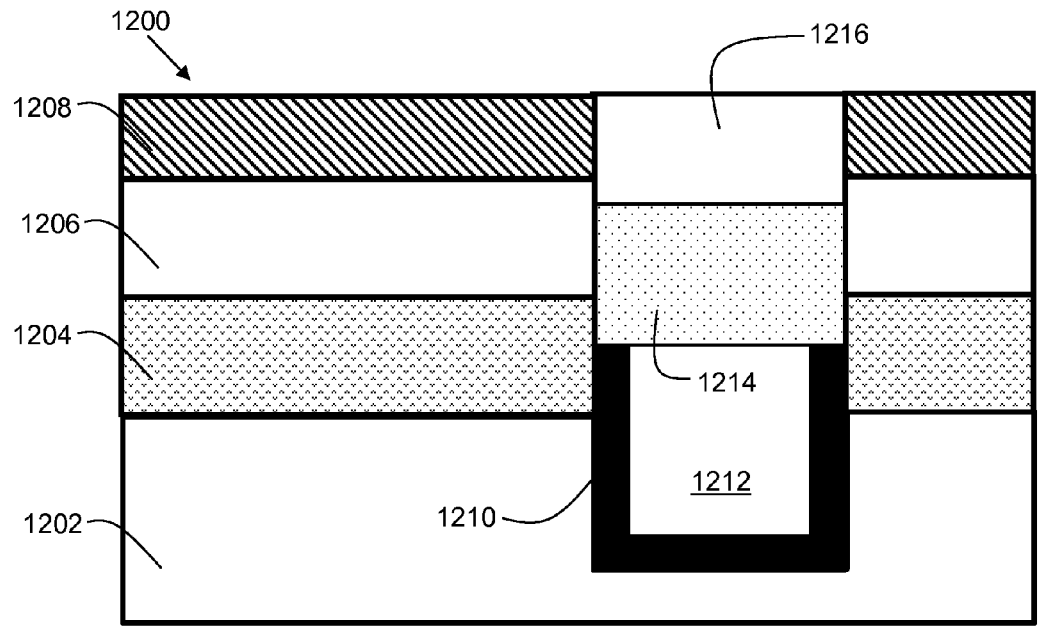

FIG. 12 shows a semiconductor structure at an intermediate fabrication step of a first oxide formation in accordance with another alternative embodiment of the present invention.

Figure 13:
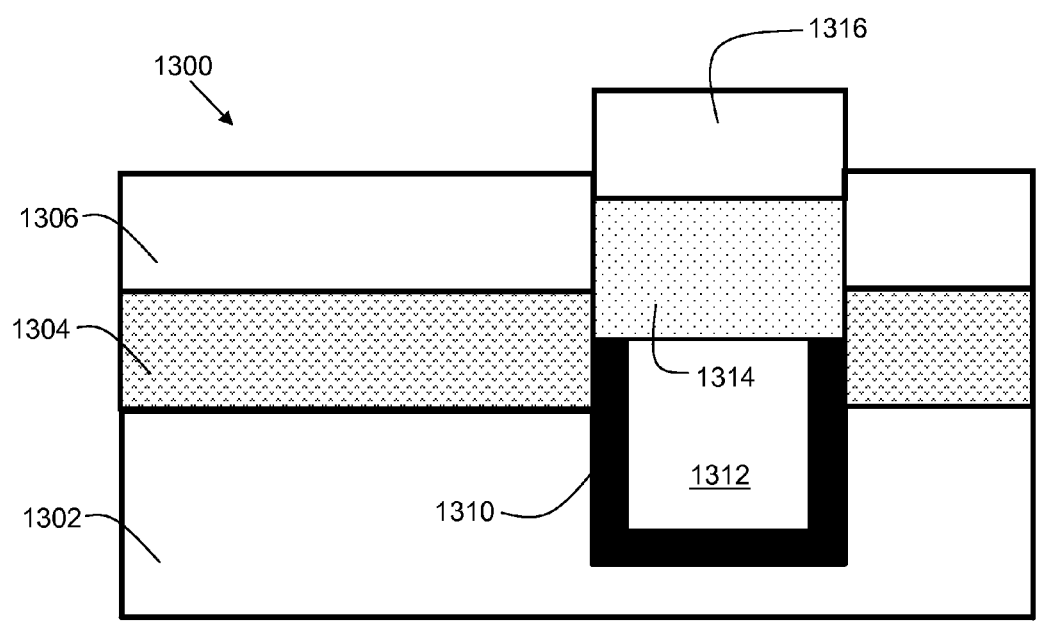

FIG. 13 shows a semiconductor structure at a subsequent processing step of pad layer removal.

Figure 14:
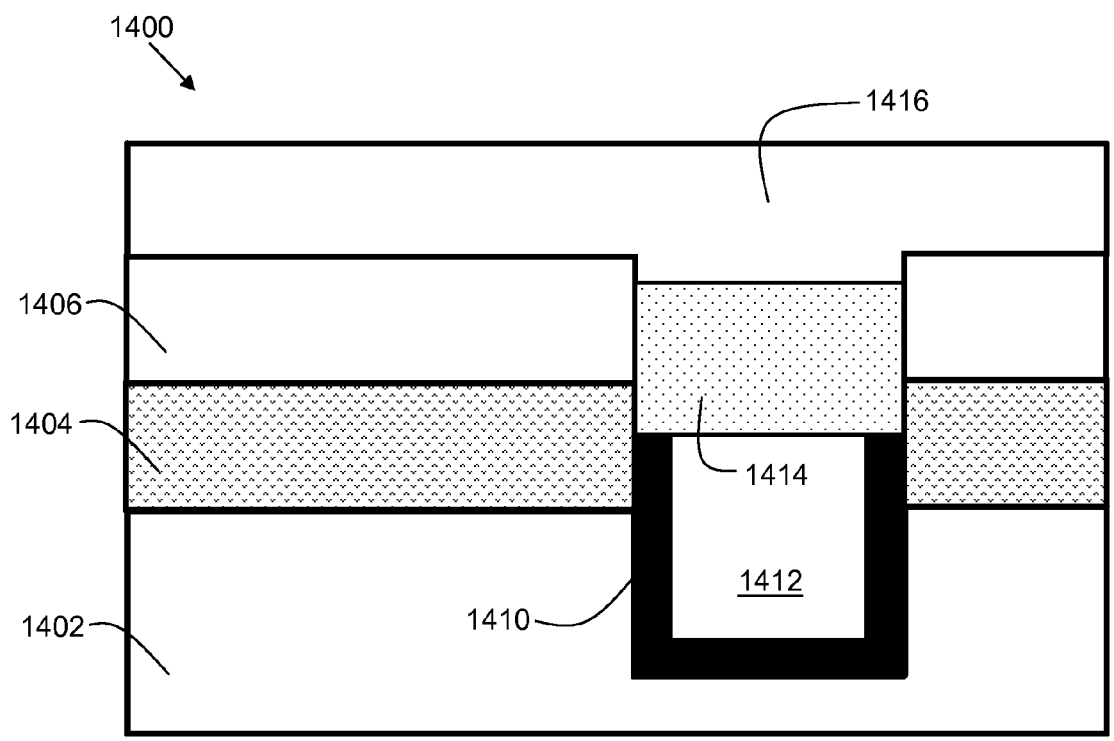

FIG. 14 shows a semiconductor structure at an intermediate fabrication step of a second oxide formation and planarization.

Figure 15:
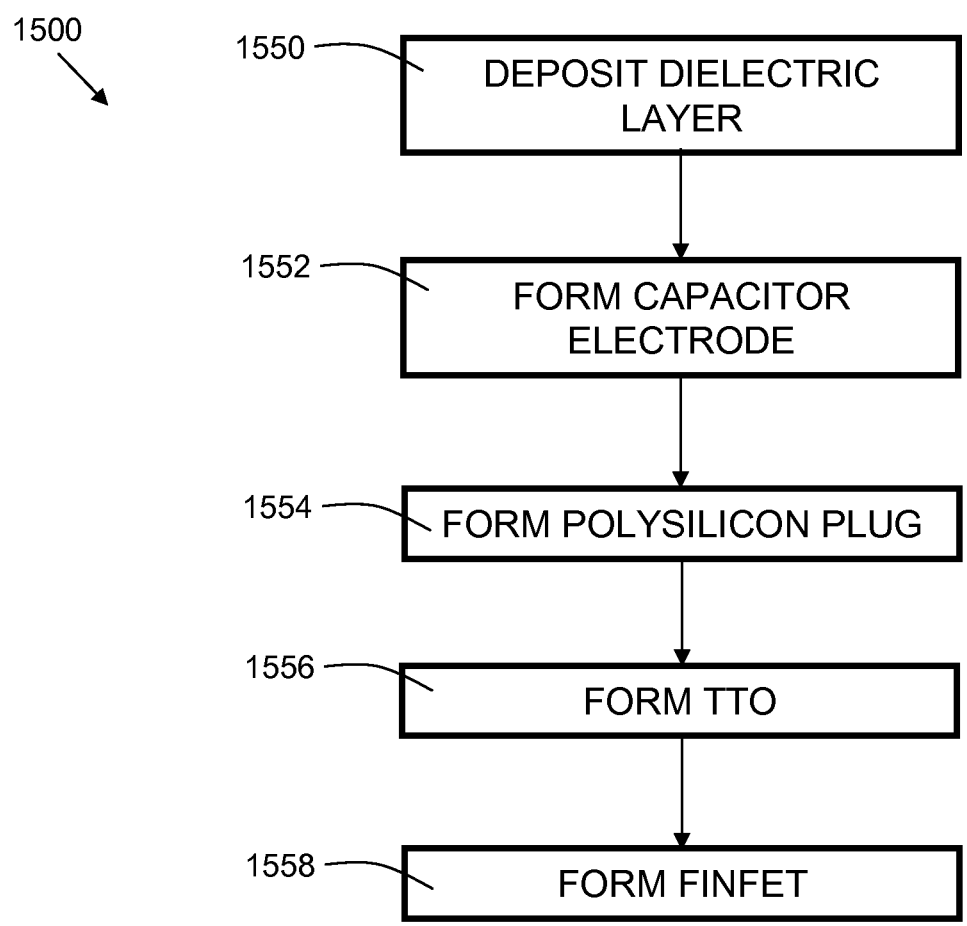

FIG. 15 is a flowchart indicating process steps for a method in accordance with embodiments of the present invention.

Figure 16:
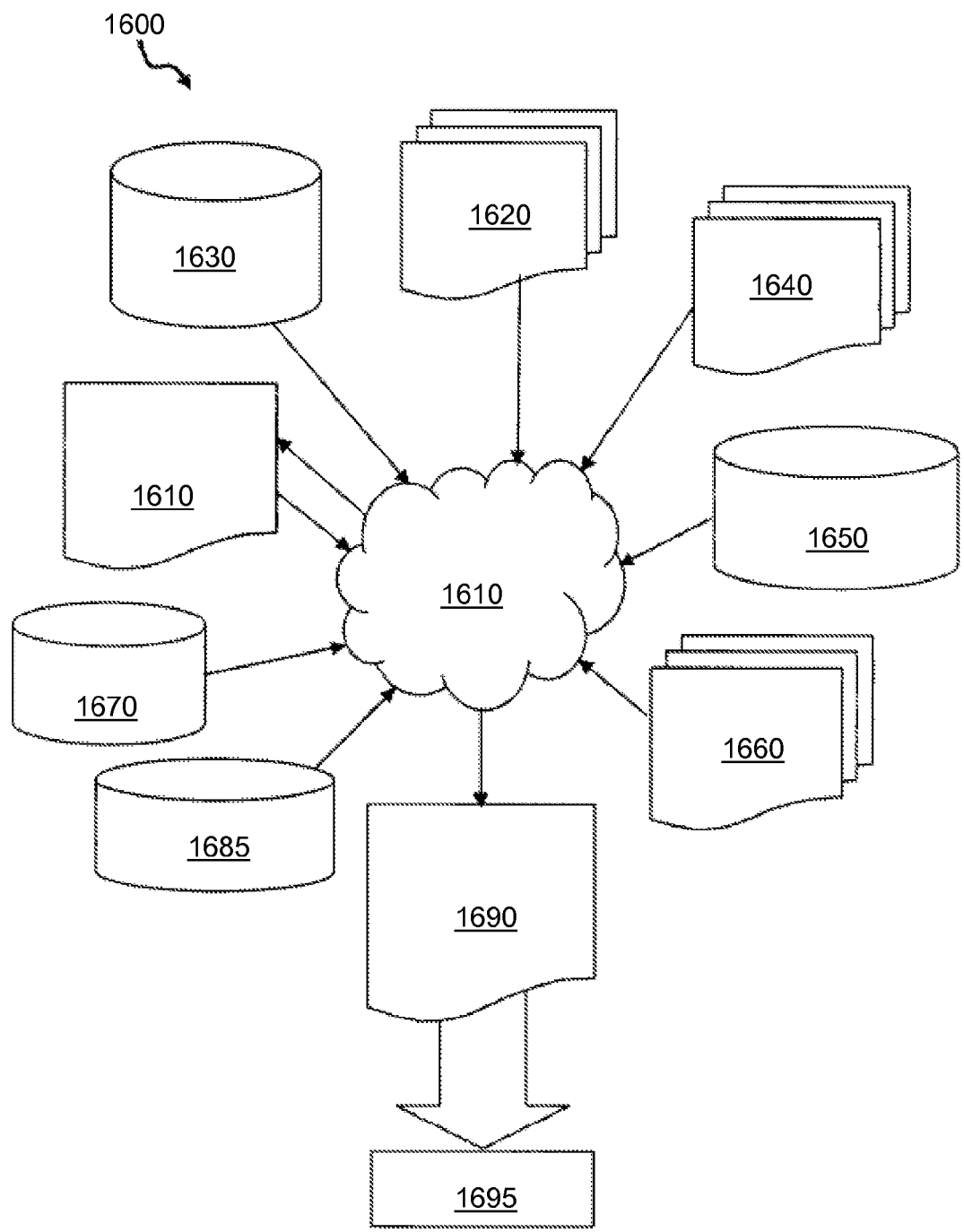

FIG. 16 shows a block diagram of an exemplary design flow.

DETAILED DESCRIPTION

FIG. 1 shows a semiconductor structure 100 at a starting point for methods in accordance with embodiments of the present invention. Semiconductor structure 100 comprises a silicon substrate 102. Disposed on the silicon substrate is insulator layer 104. Insulator layer 104 may be comprised of oxide, and may be referred to as a buried oxide (BOX) layer. Disposed on insulator layer 104 is a second silicon layer 106. Second silicon layer 106 may be referred to as a silicon-on-insulator (SOI) layer, and hence, semiconductor structure 100 may be referred to as a silicon-on-insulator structure. Disposed on second silicon layer 106 is a pad nitride layer 108. A cavity or trench 111 is formed in the semiconductor structure 100. A trench dielectric layer 110 is disposed on the interior surface of the trench. In particular, the trench dielectric layer 110 is disposed on the bottom of the trench and the lower sidewalls of the trench 111. A capacitor electrode 112 comprised of a conductive material is deposited in the lower portion of the trench. As a capacitor is a two-terminal device, capacitor electrode 112 serves as one of the two electrodes. The second electrode may be a so-called "buried plate" comprising a doped region 117 within silicon substrate 102.

In some embodiments, the trench dielectric layer 110 may comprise silicon nitride, Al2O3, HfO2, Ta2O5, or ZrO2. Other materials are possible for dielectric layer 110. In some embodiments, the capacitor electrode 112 may comprise polysilicon, titanium, tungsten, molybdenum, cobalt, titanium silicide, tungsten silicide, molybdenum silicide, or cobalt silicide. Other materials may be used for capacitor electrode 112.

FIG. 2 shows a semiconductor structure 200 after a subsequent step of pad nitride layer removal (compare with 108 of FIG. 1). As stated previously, often, similar elements may be referred to by similar numbers in various figures (FIGs) of the drawing, in which case typically the last two significant digits may be the same, the most significant digit being the number of the drawing figure (FIG). For example, silicon substrate 202 of FIG. 2 is similar to silicon substrate 102 of FIG. 1. In some embodiments, the pad nitride layer removal is performed via a selective wet etch process.

FIG. 3 shows a semiconductor structure 300 after a subsequent step of oxide formation. Oxide layer 316 is formed such that it grows at a first rate R1 over the second silicon layer 306, which is a single crystal silicon layer, and it grows at a second rate R2 over the polysilicon plug 314. Embodiments of the present invention may utilize the different growth rates to form an oxide layer 316 that is planar at a depth (thickness) D1 over the second silicon layer 306 and at a depth D2 over the polysilicon plug 314. The oxidation (growth) rate over the polysilicon plug 314 is faster than the oxidation rate over the second silicon layer 316. In one embodiment, oxidation parameters may be selected such that the oxide layer 306 is planar when the oxide thickness reaches predetermined depth D1 over the second silicon layer 316. The following formulas may be used to compute a desired thickness and oxidation time.

$$D1 = R1 Tx$$

$$D32\ 2 = R2 Tx$$

$$D2 = D1 + d$$

Where: Tx is an oxidation process time; d is the offset distance between the top of the polysilicon plug 314 and top of the second silicon layer 306; R1 is the oxidation rate over the second silicon layer; R2 is the oxidation rate over the polysilicon plug; and R2>R1.

In one embodiment, the oxidation process temperature is a parameter that is tuned (adjusted) to achieve the relationship between R2 and R1 such that the oxide layer is planar when it reaches a level of D1 over the second silicon layer 316. In one embodiment, the temperature is in the range of about 700 degrees Celsius to about 1000 degrees Celsius. The ratio R2/R1 is a function of the oxidation process temperature. As the oxidation process temperature decreases, the ratio R2/R1 increases. Hence, adjusting the temperature can tune the oxidation process so that it is planar at the desired thickness.

Given certain design parameters, the formulas can be solved to determine D1, D2, and Tx. Rates R1 and R2 may be non-linear functions of multiple parameters. An oxide growth calculation, such as the Grove Model, may be used to compute an oxidation rate during the oxidation process, such that appropriate oxidation parameters may be selected to achieve a planar oxide layer (such as 316 of FIG. 3), thus avoiding the need for a planarization step, which saves cost and reduces fabrication time.

FIG. 4 shows a semiconductor structure 400 of an alternative embodiment after a subsequent step of oxide formation. In this embodiment, if the oxide growth rates are not sufficiently tuned, there may be a non-planar region 416R. In this case, a planarization process, such as a chemical mechanical polish (CMP) may be used to planarize the oxide such that it is similar to semiconductor structure 300 of FIG. 3.

FIG. 5 shows a semiconductor structure 500 after a subsequent step of planarization to form trench top oxide (TTO) region 516.

FIG. 6 shows a semiconductor structure 600 after a subsequent step of depositing a fin cap layer 618. The fin cap layer 618 may be comprised of nitride, and is used to protect the second silicon layer 606, which will constitute the fins of the finFET once fabrication is complete.

FIG. 7 shows a perspective view of a trench top oxide 716 after deposition of a fin cap layer 718. The trench top oxide (TTO) 716 is disposed on the capacitor node 724 (which may include a polysilicon or metal conductor and the polysilicon plug). The second silicon layer 706 is adjacent to the TTO 716, and is disposed over the insulator layer (BOX) 704 and a portion of the capacitor node 724. In one embodiment, the thickness W of the TTO 716 ranges from about 10 nanometers to about 30 nanometers.

FIG. 8 shows a semiconductor structure 800 in accordance with an embodiment of the present invention showing a top-down view of a finFET 821 comprising a gate 823. The gate 823 comprises a plurality of silicon fins 825, which comprise a source/drain for finFET 821. The fins 825 are adjacent to, and in contact with, trench capacitor 819. Trench capacitor 819 has a trench top oxide (TTO) 816 covering its top. A passing gate 831 is disposed over the trench top oxide 816. The drawing shows the passing gate 831 as transparent, so that the trench top oxide 816 is visible "behind" the passing gate 831. In one embodiment, the passing gate 831 is part of a finFET transistor for a neighboring DRAM cell having fins 837 connected to adjacent cell(s). The passing gate 831 may be in direct physical contact with the trench top oxide region 816. Alternatively, there may be a dielectric layer (not shown) disposed in between the gate 831 and the TTO 816. In a DRAM circuit embodiment, the gate 831 may be electrically connected to a word line. The trench top oxide 816 may therefore provide improved isolation between the trench capacitor and a word line. Hence, semiconductor structure 800 integrates a trench capacitor 819 with a finFET by providing trench top oxide 816 to provide additional electrical isolation from the passing gate 831, thus allowing the gate to "pass over" the trench capacitor 819 without interfering with its electrical operation.

FIG. 9 shows a semiconductor structure 900 at an intermediate fabrication step of a first oxide formation in accordance with an alternative embodiment of the present invention. In this embodiment, a first oxide region 916 is formed that extends part way into pad nitride layer 908.

FIG. 10 shows a semiconductor structure 1000 at a subsequent processing step of pad nitride layer removal (compare with 908 of FIG. 9). The pad nitride layer may be removed with a selective wet etch.

FIG. 11 shows a semiconductor structure 1100 at an intermediate fabrication step of formation of a second oxide region 1116. Optionally, a planarization process may follow formation of the second oxide region 1116. The planarization process may include a chemical mechanical polish (CMP) process. From this point, the fabrication process proceeds similar to the embodiment described in FIGS. 5-8.

FIG. 12 shows a semiconductor structure 1200 at an intermediate fabrication step of forming a first oxide region 1216 in accordance with another alternative embodiment of the present invention. In this embodiment, the first oxide region 1216 is grown above the level of pad nitride layer 1208, and then planarized such that the first oxide region 1216 is level with the top of the pad nitride layer 1208.

FIG. 13 shows a semiconductor structure 1300 at a subsequent processing step of pad nitride layer removal (compare with 1208 of FIG. 12). The pad nitride layer may be removed with a selective wet etch.

FIG. 14 shows a semiconductor structure 1400 at an intermediate fabrication step of forming a second oxide region 1416, and performing a subsequent planarization process. The planarization process may include a chemical mechanical polish (CMP) process. From this point, the fabrication process proceeds similar to the embodiment described in FIGS. 5-8.

Hence there are various embodiments of the present invention that provide varying degrees of oxide formation control along with various levels of process complexity. The embodiments that avoid the need for planarization have the lowest complexity, but also the least amount of control over the oxide growth. The embodiments that use multiple stages of oxide growth have more control, but also more complexity. The embodiments that use multiple stages of oxide growth along with one or more planarization steps have the most complexity, but also the most control over the oxide growth. Hence, a process engineer can select an embodiment that is most appropriate for a given process, taking into consideration such factors as node size, desired yield, and manufacturing throughput.

FIG. 15 is a flowchart 1500 indicating process steps for a method in accordance with embodiments of the present invention. In process step 1550 a node dielectric layer is deposited (see 110 of FIG. 1). In process step 1552, a capacitor electrode is formed (see 112 of FIG. 1). In process step 1554, a polysilicon plug is formed (see 114 of FIG. 1). In process step 1556, a trench top oxide (TTO) is formed (see 716 of FIG. 7 and 816 of FIG. 8). In process step 1558, a finFET is formed, which comprises a gate electrode (see 828 of FIG. 8) disposed on a gate dielectric (see 826 of FIG. 8) which is disposed over the trench top oxide (see 816 of FIG. 8).

FIG. 16 shows a block diagram of an exemplary design flow 1600 used for example, in semiconductor IC logic design, simulation, test, layout, and manufacture. Design flow 1600 includes processes, machines and/or mechanisms for processing design structures or devices to generate logically or otherwise functionally equivalent representations of the design structures and/or devices described above and shown in FIGS. 1-31. The design structures processed and/or generated by design flow 1600 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 1600 may vary depending on the type of representation being designed. For example, a design flow 1600 for building an application specific IC (ASIC) may differ from a design flow 1600 for designing a standard component or from a design flow 1600 for instantiating the design into a programmable array, for example a programmable gate array (PGA) or a field programmable gate array (FPGA) offered by Altera® Inc. or Xilinx® Inc.

FIG. 16 illustrates multiple such design structures including an input design structure 1620 that is preferably processed by a design process 1610. Design structure 1620 may be a logical simulation design structure generated and processed by design process 1610 to produce a logically equivalent functional representation of a hardware device. Design structure 1620 may also or alternatively comprise data and/or program instructions that when processed by design process 1610, generate a functional representation of the physical structure of a hardware device. Whether representing functional and/or structural design features, design structure 1620 may be generated using electronic computer-aided design (ECAD) such as implemented by a core developer/designer. When encoded on a machine-readable data transmission, gate array, or storage medium, design structure 1620 may be accessed and processed by one or more hardware and/or software modules within design process 1610 to simulate or otherwise functionally represent an electronic component, circuit, electronic or logic module, apparatus, device, or system such as those shown in FIGS. 1-15. As such, design structure 1620 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 1610 preferably employs and incorporates hardware and/or software modules for synthesizing, translating, or otherwise processing a design/simulation functional equivalent of the components, circuits, devices, or logic structures shown in FIGS. 1-15 to generate a Netlist 1680 which may contain design structures such as design structure 1620. Netlist 1680 may comprise, for example, compiled or otherwise processed data structures representing a list of wires, discrete components, logic gates, control circuits, I/O devices, models, etc. that describes the connections to other elements and circuits in an integrated circuit design. Netlist 1680 may be synthesized using an iterative process in which netlist 1680 is resynthesized one or more times depending on design specifications and parameters for the device. As with other design structure types described herein, netlist 1680 may be recorded on a machine-readable data storage medium or programmed into a programmable gate array. The medium may be a non-transitory, non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 1610 may include using a variety of inputs; for example, inputs from library elements 1630 which may house a set of commonly used elements, circuits, and devices, including models, layouts, and symbolic representations, for a given manufacturing technology (e.g., different technology nodes, 32 nm, 45 nm, 90 nm, etc.), design specifications 1640, characterization data 1650, verification data 1660, design rules 1670, and test data files 1685 (which may include test patterns and other testing information). Design process 1610 may further include, for example, standard circuit design processes such as timing analysis, verification, design rule checking, place and route operations, etc. One of ordinary skill in the art of integrated circuit design can appreciate the extent of possible electronic design automation tools and applications used in design process 1610 without deviating from the scope and spirit of the invention. The design structure of the invention is not limited to any specific design flow.

Design process 1610 preferably translates an embodiment of the invention as shown in FIGS. 1-15, along with any additional integrated circuit design or data (if applicable), into a second design structure 1690. Design structure 1690 resides on a storage medium in a data format used for the exchange of layout data of integrated circuits (e.g. information stored in a GDSII (GDS2), GL1, OASIS, or any other suitable format for storing such design structures). Design structure 1690 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as described above with reference to FIGS. 1-15. Design structure 1690 may then proceed to a stage 1695 where, for example, design structure 1690 proceeds to tape-out, is released to manufacturing, is released to a mask house, is sent to another design house, is sent back to the customer, etc.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A method of fabricating a semiconductor structure, comprising:
   depositing a dielectric layer on an interior surface of a cavity in a silicon-on-insulator structure, wherein the silicon-on-insulator structure comprises a first silicon layer, an insulator layer disposed on the first silicon layer; a second silicon layer disposed on the insulator layer, and a nitride layer disposed on the second silicon layer;
   forming a capacitor electrode in a lower portion of the cavity;
   forming a polysilicon plug on the capacitor electrode, wherein the polysilicon plug is in direct physical contact with both sides of the cavity;
   forming a first oxide region on the polysilicon plug;
   planarizing the first oxide region to the nitride layer;
   removing the nitride layer;
   forming a second oxide region, wherein the second oxide region is disposed over, and in direct physical contact with the first oxide region and in direct physical contact with the second silicon layer; and
   forming a finFET, said finFET comprising a plurality of fins and a gate electrode, said gate electrode disposed over a portion of the plurality of fins, wherein the gate electrode of the finFET is in direct physical contact with the first oxide region in an upper portion of the cavity.

2. The method of claim 1, wherein planarizing the first oxide region to the nitride layer is performed via a chemical mechanical polish process.

3. The method of claim 1, wherein depositing a dielectric layer on the interior surface of the cavity comprises depositing a dielectric layer selected from the group consisting of: silicon nitride, Al2O3, HfO2, Ta2O5, and ZrO2.

4. The method of claim 1, wherein forming a capacitor electrode in a lower portion of the cavity comprises depositing a conductive material in the cavity, wherein the conductive material is selected from the group consisting of: polysilicon, titanium, tungsten, molybdenum, cobalt, titanium silicide, tungsten silicide, molybdenum silicide, and cobalt silicide.

5. The method of claim 1, further comprising planarizing the second silicon layer.

* * * * *